United States Patent
Refai-Ahmed et al.

(10) Patent No.: US 10,085,363 B2
(45) Date of Patent: Sep. 25, 2018

(54) INTEGRATED COMPACT IMPINGEMENT ON EXTENDED HEAT SURFACE

(71) Applicant: General Electric Company, Schenectady, NY (US)

(72) Inventors: Gamal Refai-Ahmed, Albany, NY (US); Hendrik Pieter Jacobus de Bock, Clifton Park, NY (US); Yogen Vishwas Utturkar, Niskayuna, NY (US); Matthew A. Ferguson, Ruckersville, VA (US); Bryan Patrick Whalen, Gansevoort, NY (US); Christian M. Giovanniello, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 435 days.

(21) Appl. No.: 14/285,034

(22) Filed: May 22, 2014

(65) Prior Publication Data
US 2015/0342088 A1    Nov. 26, 2015

(51) Int. Cl.
*F28F 7/00*     (2006.01)
*H05K 5/00*    (2006.01)
(Continued)

(52) U.S. Cl.
CPC .......... *H05K 7/20272* (2013.01); *B23P 15/26* (2013.01); *H01L 23/467* (2013.01);
(Continued)

(58) Field of Classification Search
CPC ............... H01L 23/467; H01L 23/4336; H01L 23/4735; F28F 13/10; F28F 2250/08
(Continued)

(56) References Cited

U.S. PATENT DOCUMENTS 7,733,649 B2 *   6/2010   Anderl ...................... G06F 1/20
                                                              174/16.1
7,821,788 B2 * 10/2010   Hsiao ........................ G06F 1/20
                                                              361/679.48
(Continued)

FOREIGN PATENT DOCUMENTS

EP        2239775 A2    10/2010

OTHER PUBLICATIONS

Lagorce et al., "Batch-Fabricated Microjet Coolers for Electronic Components", Proceedings of the International Symposium on Microelectronics, vol. No. 3252, pp. 494-499, Jan. 1, 1997.
(Continued)

*Primary Examiner* — Jason Thompson
(74) *Attorney, Agent, or Firm* — Ziolkowski Patent Solutions Group, SC; Jean K. Testa

(57) ABSTRACT

A thermal management system that provides cooling to an electronic device is disclosed. The thermal management system includes a surface having a plurality of extended elements thermally coupled to the surface, a plurality of vibrator assemblies configured to generate a cooling flow across the surface, and a mounting structure disposed atop the plurality of extended elements of the surface to position the plurality of vibrator assemblies relative to the surface. The mounting structure is configured to orient each of the plurality of vibrator assemblies to the surface at an angel, such that the cooling flow generated by the plurality of vibrator assemblies impinges on the extended elements at an angle.

15 Claims, 7 Drawing Sheets

(51) Int. Cl.
*H05K 7/20* (2006.01)
*B23P 15/26* (2006.01)
*H01L 23/467* (2006.01)

(52) U.S. Cl.
CPC .. *H05K 7/20263* (2013.01); *H01L 2924/0002* (2013.01); *Y10T 29/49352* (2015.01)

(58) Field of Classification Search
USPC .................. 165/908; 361/679.48–679.51
See application file for complete search history.

(56) References Cited

U.S. PATENT DOCUMENTS

| | | | | |
|---|---|---|---|---|
| 8,050,029 | B1* | 11/2011 | Kam | G06F 1/206 |
| | | | | 312/236 |
| 8,064,199 | B2* | 11/2011 | Lin | G06F 1/185 |
| | | | | 361/679.31 |
| 8,322,405 | B2* | 12/2012 | Tang | H01L 23/467 |
| | | | | 165/80.3 |
| 8,342,819 | B2 | 1/2013 | Arik et al. | |
| 8,547,694 | B2* | 10/2013 | Tang | G06F 1/20 |
| | | | | 312/236 |
| 8,837,138 | B2* | 9/2014 | Wiltzius | G06F 1/20 |
| | | | | 361/679.46 |
| 2003/0089490 | A1* | 5/2003 | Song | H01L 23/467 |
| | | | | 165/121 |
| 2004/0190305 | A1* | 9/2004 | Arik | F21V 29/02 |
| | | | | 362/555 |
| 2005/0145366 | A1* | 7/2005 | Erel | H01L 23/467 |
| | | | | 165/80.3 |
| 2005/0280986 | A1* | 12/2005 | Coglitore | H05K 7/20736 |
| | | | | 361/679.49 |
| 2007/0091571 | A1* | 4/2007 | Malone | G06F 1/20 |
| | | | | 361/699 |
| 2008/0083527 | A1* | 4/2008 | Horng | H05K 7/20972 |
| | | | | 165/80.3 |
| 2011/0024092 | A1* | 2/2011 | Gerlach | F28D 1/05333 |
| | | | | 165/104.34 |
| 2011/0114287 | A1* | 5/2011 | Arik | H05K 7/20172 |
| | | | | 165/67 |
| 2011/0157815 | A1* | 6/2011 | Lin | G06F 1/20 |
| | | | | 361/679.48 |
| 2011/0259557 | A1* | 10/2011 | Chao | F04B 43/046 |
| | | | | 165/121 |
| 2012/0012286 | A1* | 1/2012 | Salamon | F28F 3/04 |
| | | | | 165/120 |
| 2012/0098424 | A1* | 4/2012 | Arik | F21V 23/006 |
| | | | | 315/35 |

OTHER PUBLICATIONS

European Search Report and Opinion issued in connection with corresponding EP Application No. 15168679.7 dated Dec. 4, 2015.

* cited by examiner

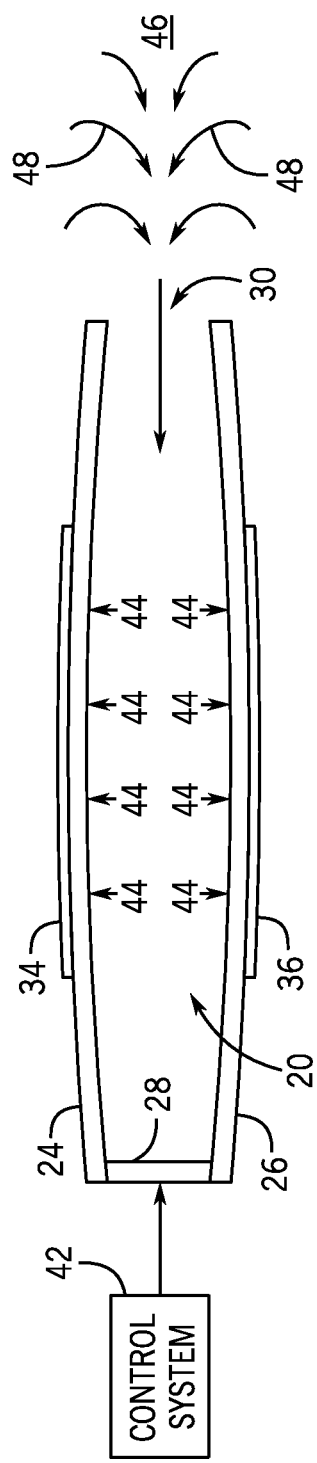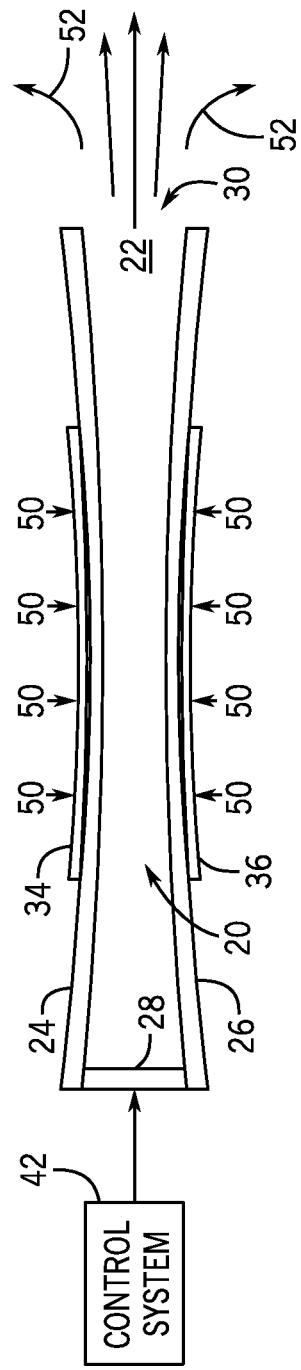

US 10,085,363 B2

INTEGRATED COMPACT IMPINGEMENT ON EXTENDED HEAT SURFACE

BACKGROUND OF THE INVENTION

Embodiments of the invention relate generally to a thermal management system, and, more specifically to an impingement flow cooling apparatus that provides for thermal management of an external extended heat surface.

In today's market, electronic devices are becoming smaller and smaller, while also having more capabilities and computational power. As a result, it is important for electronic components and systems to be quiet, reliable, and have a small physical footprint.

While passive cooling systems, such as heat sinks, are the most reliable cooling systems, they are also the least efficient. In order for a heat sink to be capable of dissipating more heat, the physical footprint is increased by including extended surfaces such as fins, ribs, and other protrusions. Therefore, active cooling systems, such as air or liquid cooling devices, can be added to the heat sink to increase the efficiency. However, the addition of active cooling systems also may introduce other design challenges, such as acoustic noise and reliability.

The current prior art uses a combination of passive cooling systems, such as heat sinks, and active cooling systems, such as fans, which are limited with respect to physical form factor, operating condition, acoustic noise, and reliability. A drawback of the existing fan solution includes the associated acoustic noise with the moving parts of the fan. Another drawback includes the reliability of the fan solution. That is, an active fan thermal solution generally includes a multitude of moving parts that can break down. In addition, fan based cooling systems generally require a larger physical footprint to achieve the necessary volume flow rate of a cooling fluid, and this larger footprint can be problematic for electronic devices having tight space constraints.

Accordingly, there is a need for a thermal management system that provides active and passive cooling to an electronic device in a manner that allows for the thermal management system to operate with lower acoustic noise and increased durability without increasing the physical footprint of the thermal management system.

BRIEF DESCRIPTION OF THE INVENTION

In accordance with one aspect of the invention, a thermal management system includes a surface having a plurality of extended elements thermally coupled to the surface, a plurality of vibrator assemblies configured to generate a cooling flow across the surface, and a mounting structure disposed atop the plurality of extended elements of the surface to position the plurality of vibrator assemblies relative to the surface. Further, the mounting structure is configured to orient each of the plurality of vibrator assemblies to the surface at an angel, such that the cooling flow generated by the plurality of vibrator assemblies impinges on the extended elements at an angle.

In accordance with another aspect of the invention, a system includes at least one heat generating component, a surface element thermally coupled to the at least one heat generating component, a plurality of synthetic jet assemblies, and a mounting device disposed atop the surface element and configured to orient each of the plurality of synthetic jet assemblies at an angle relative to the surface element. Each synthetic jet assembly comprises a synthetic jet configured to generate a flow of cooling fluid and a mounting bracket coupled to the synthetic jet. Further, the flow of cooling fluid generated by each of the plurality of synthetic jet assemblies impinges on the surface element at an angle.

In accordance with yet another aspect of the invention, a method of manufacturing a thermal management system includes providing an electrical system having at least one heat generating component and mounting a surface element on the electrical system such that it is in thermal communication with the at least one heat generating component, the surface element including a plurality of extended elements protruding therefrom to aid in convective heat transfer from the surface element. The method also includes affixing a mounting structure to the heat sink adjacent the plurality of extended elements and coupling a plurality of synthetic jet assemblies to the mounting structure such that each of the plurality of synthetic jet assemblies are positioned at an angel relative to the surface element.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

FIG. 3 is a cross-section view of the synthetic jet of FIG. 2 depicting the synthetic jet as the control system causes the diaphragms to travel inward, toward the orifice.

FIG. 4 is a cross-section view of the synthetic jet of FIG. 2 depicting the synthetic jet as the control system causes the diaphragms to travel outward, away from the orifice.

DETAILED DESCRIPTION

Embodiments of the invention provide a thermal management system that utilizes active cooling device that direct a fluid flow across a heat sink, with a mounting structure being implemented to orient the cooling devices at an angle to the heat sink such that the fluid flow impinges on the heat sink at said angle. The angular mounting of the active cooling devices provided by the mounting structure results in the active cooling devices occupying a much smaller physical volume than current active fan cooling systems.

For purposes of better understanding aspects of the invention, an exemplary embodiment of an active cooling device—and of the operation thereof—is illustrated in FIGS. 1-4 that may be utilized in a thermal management system, according to embodiments of the invention. It is recognized that embodiments of the invention are not meant to be limited to use of a specific active cooling device in the thermal management system; however, in an exemplary embodiment, a vibration-type active cooling device (e.g., synthetic jet actuator) is utilized in the thermal management system.

Figure 1:
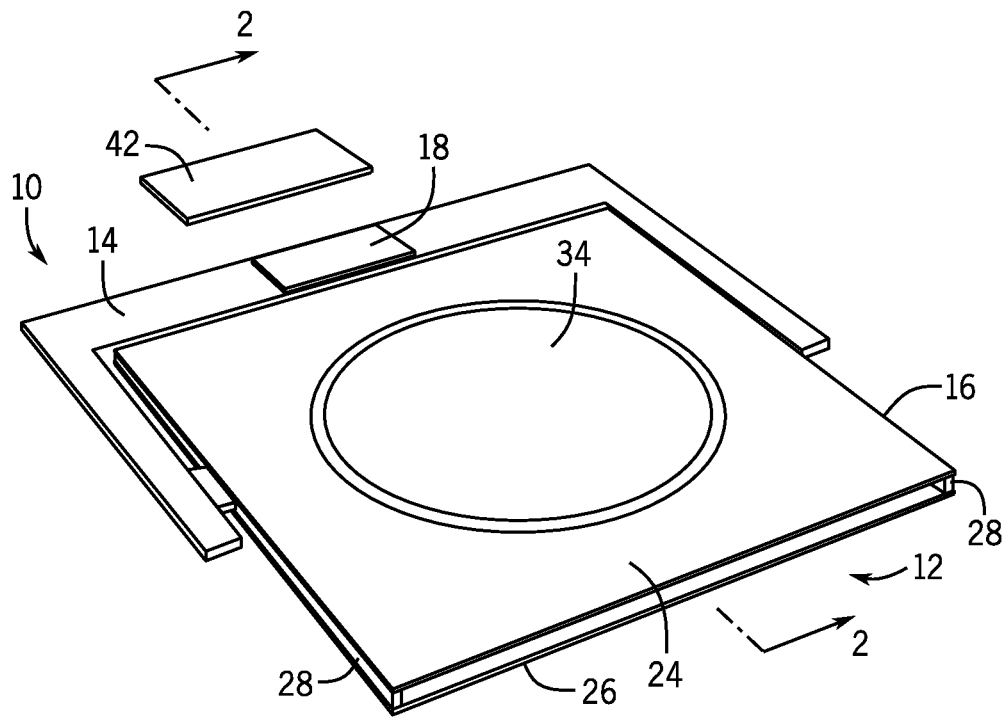
FIG. 1 is a perspective view of a synthetic jet assembly usable with a thermal management system, according to an embodiment of the invention.
Figure 2:
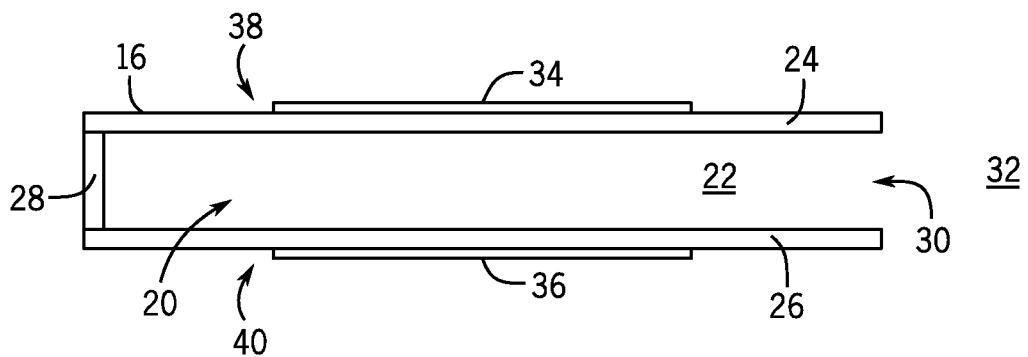
FIG. 2 is a cross-section view of a synthetic jet, according to an embodiment of the invention.

Referring first to FIG. 1, a perspective view of a vibration-type active cooling device in the form of a synthetic jet assembly 10 is provided. Synthetic jet assembly 10 includes a synthetic jet 12, a cross-section of which is illustrated in FIG. 2, and a mounting bracket 14. In one embodiment, mounting bracket 14 is a u-shaped bracket that is affixed to a housing 16 of synthetic jet 12 at one or more locations. A circuit driver 18 can be externally located or affixed to mounting bracket 14. Alternatively circuit driver 18 may be remotely located from synthetic jet assembly 10.

Referring now to FIGS. 1 and 2 together, housing 16 of synthetic jet 12 defines and partially encloses an internal chamber or cavity 20 having a gas or fluid 22 therein. While housing 16 and internal chamber 20 can take virtually any geometric configuration according to various embodiments of the invention, for purposes of discussion and understanding, housing 16 is shown in the cross-section view in FIG. 2 as including a first plate 24 and a second plate 26, which are maintained in a spaced apart relationship by a spacer element 28 positioned therebetween. One or more orifices 30 are formed between first and second plates 24, 26 and side walls of spacer element 28 in order to place the internal chamber 20 in fluid communication with a surrounding, exterior environment 32. In an alternative embodiment, spacer element 28 includes a front surface (not shown) in which one or more orifices 30 are formed.

According to various embodiments, first and second plates 24, 26 may be formed from a metal, plastic, glass, and/or ceramic. Likewise, spacer element 28 may be formed from a metal, plastic, glass, and/or ceramic. Suitable metals include materials such as nickel, aluminum, copper, and molybdenum, or alloys such as stainless steel, brass, bronze, and the like. Suitable polymers and plastics include thermoplastics such as polyolefins, polycarbonate, thermosets, epoxies, urethanes, acrylics, silicones, polyimides, and photoresist-capable materials, and other resilient plastics. Suitable ceramics include, for example, titanates (such as lanthanum titanate, bismuth titanate, and lead zirconate titanate) and molybdates. Furthermore, various other components of synthetic jet 12 may be formed from metal as well.

Actuators 34, 36 are coupled to respective first and second plates, 24, 26 to form first and second composite structures or flexible diaphragms 38, 40—such that the synthetic jet 12 is constructed as a "dual cool jet." The flexible diaphragms 38, 40 are controlled by driver 18 via a controller assembly or control unit system 42. As shown in FIG. 1, in one embodiment controller assembly 42 is electronically coupled to driver 18, which is coupled directly to mounting bracket 14 of synthetic jet 12. In an alternative embodiment, control unit system 42 is integrated into a driver 18 that is remotely located from synthetic jet 12. For example, each flexible diaphragm 38, 40 may be moved via an electrical bias imposed between the electrode and the metal layer. Moreover, control system 42 may be configured to generate the electrical bias by any suitable device, such as, for example, a computer, logic processor, or signal generator.

In one embodiment, actuators 34, 36 are piezoelectric motive (piezomotive) devices that may be actuated by application of a harmonic alternating voltage that causes the piezomotive devices to rapidly expand and contract. During operation, control system 42 transmits an electric charge, via driver 18, to piezoelectric actuators 34, 36, which undergo mechanical stress and/or strain responsive to the charge. The stress/strain of piezomotive actuators 34, 36 causes deflection of respective first and second plates 24, 26 such that a time-harmonic or periodic motion is achieved. The resulting volume change in internal chamber 20 causes an interchange of gas or other fluid between internal chamber 20 and exterior environment 32, as described in detail with respect to FIGS. 3 and 4.

Piezomotive actuators 34, 36 may be monomorph or bimorph devices, according to various embodiments of the invention. In a monomorph embodiment, piezomotive actuators 34, 36 may be coupled to plates 24, 26 formed from materials including metal, plastic, glass, or ceramic. In a bimorph embodiment, one or both piezomotive actuators 34, 36 may be bimorph actuators coupled to plates 24, 26 formed from piezoelectric materials. In an alternate embodiment, the bimorph may include single actuators 34, 36 and plates 24, 26 are second actuators.

The components of synthetic jet 12 may be adhered together or otherwise attached to one another using adhesives, solders, and the like. In one embodiment, a thermoset adhesive or an electrically conductive adhesive is employed to bond actuators 34, 36 to first and second plates 24, 26 to form first and second composite structures 38, 40. In the case of an electrically conductive adhesive, an adhesive may be filled with an electrically conductive filler such as silver, gold, and the like, in order to attach lead wires (not shown) to synthetic jet 12.

In an embodiment of the invention, actuators 34, 36 may include devices other than piezoelectric motive devices, such as hydraulic, pneumatic, magnetic, electrostatic, and ultrasonic materials. Thus, in such embodiments, control system 42 is configured to active respective actuators 34, 36 in corresponding fashion. For example, if electrostatic materials are used, control system 42 may be configured to provide a rapidly alternative electrostatic voltage to actuators 34, 36 in order to active and flex respective first and second plates 24, 26.

The operation of synthetic jet 12 is described with reference to FIGS. 3 and 4. In FIG. 3, synthetic jet 12 is illustrated as actuators 34, 36 are controlled to cause first and second plates 24, 26 to move outward with respect to internal chamber 20, as depicted by arrows 44. As first and second plates 24, 26 flex outward, the internal volume of internal chamber 20 increases, and ambient gas or fluid 46 rushes into internal chamber 20 as depicted by the set of arrows 48. Actuators 34, 36 are controlled by control system 42 so that when first and second plates 24, 26 move outward from internal chamber 20, vortices are already removed from edges of orifice 30 and thus are not affected by the ambient fluid 46 being drawn into internal chamber 20. Meanwhile, a jet of ambient fluid 46 is synthesized by vortices creating strong entrainment of ambient fluid 46 drawn from large distances away from orifice 30.

FIG. 4 depicts synthetic jet 12 as actuators 34, 36 are controlled to cause first and second plates 24, 26 to flex inward into internal chamber 20, as depicted by arrows 50. As the internal volume of internal chamber 20 decreases, fluid 22 is ejected as a cooling jet through orifice 30 in the direction indicated by the set of arrows 52 toward a device to be cooled, such as, for example, a heat generating electronic component. As fluid 22 exits internal chamber 20 through orifice 30, the flow separates at the sharp edges of orifice 30 and creates vortex sheets which roll into vortices and begin to move away from edges of orifice 30.

While the synthetic jet of FIGS. 1-4 is shown and described as having a single orifice therein, it also envisioned that embodiments of the invention may include multiple orifice synthetic jet actuators. Additionally, while the synthetic jet actuators of FIGS. 1-4 are shown and described as having an actuator element included on each of first and second plates, it is also envisioned that embodiments of the invention may include only a single actuator element positioned on one of the plates. Furthermore, it is also envisioned that the synthetic jet plates may be provided in a circular, rectangular, or alternatively shaped configurations, rather than in a square configuration as illustrated herein.

Figure 5:
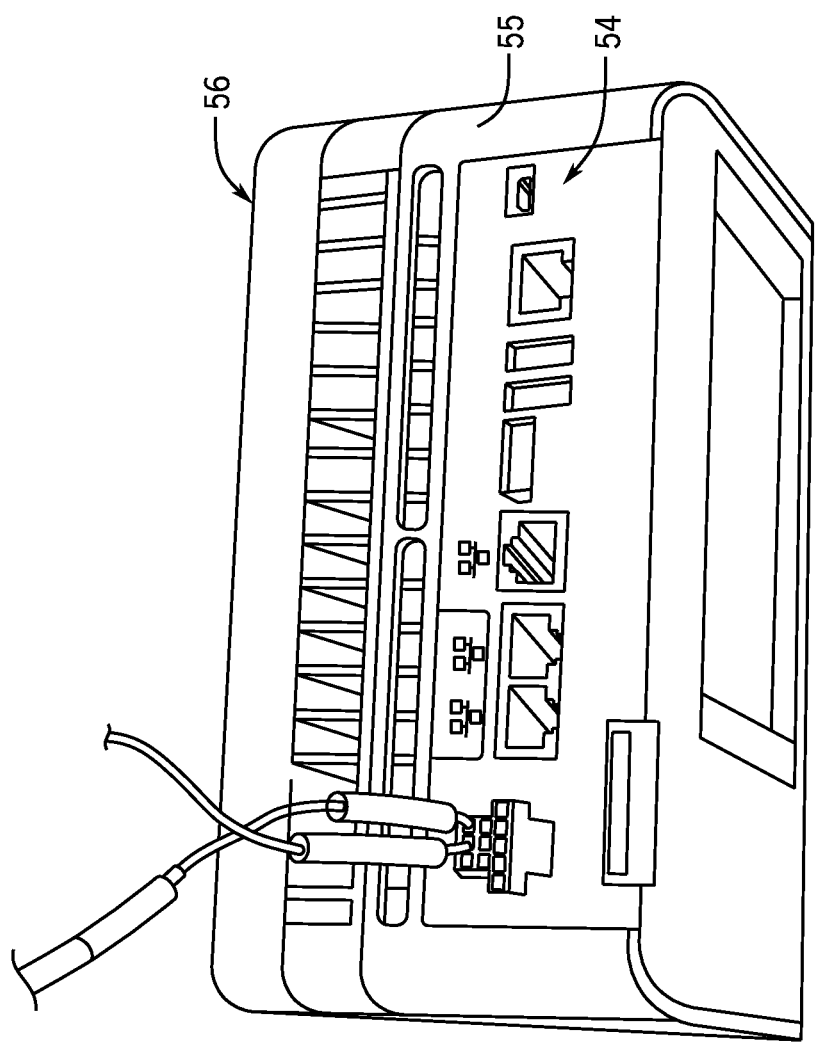
FIG. 5 is a perspective view of a computing device and associated thermal management system, according to an embodiment of the invention.
Figure 6:
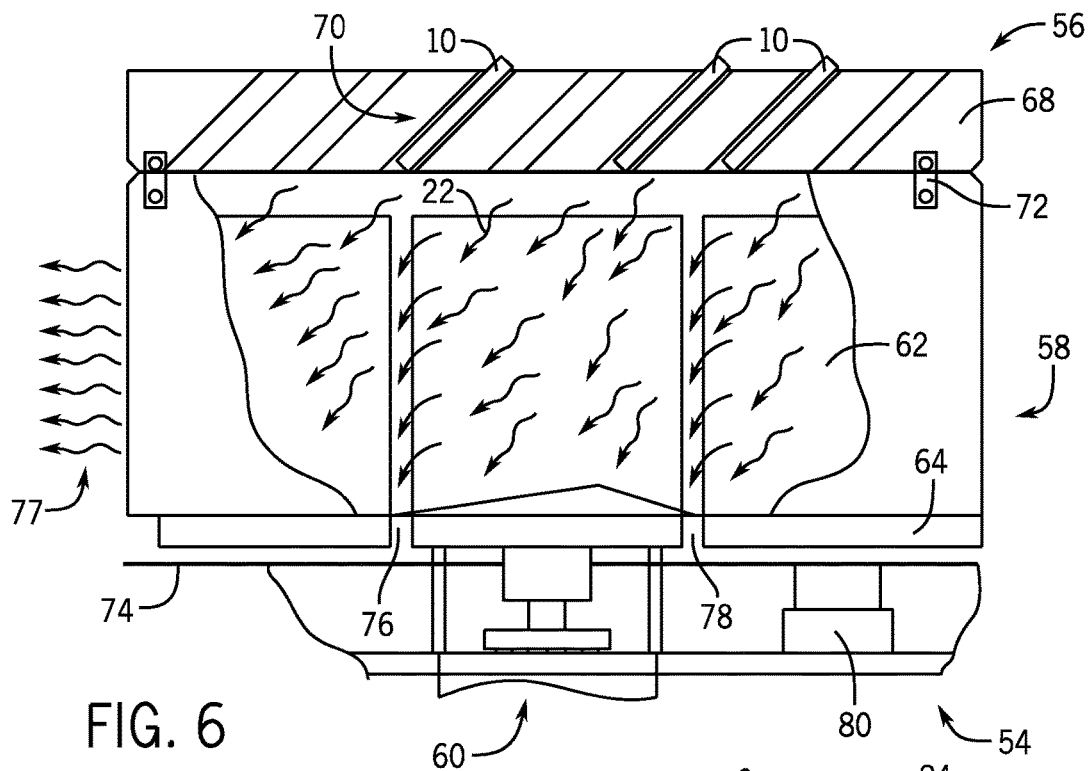
FIG. 6 is a side cross-section view of the computing device and associated thermal management system of FIG. 5 taken along line 6-6, according to an embodiment of the invention.
Figure 7:
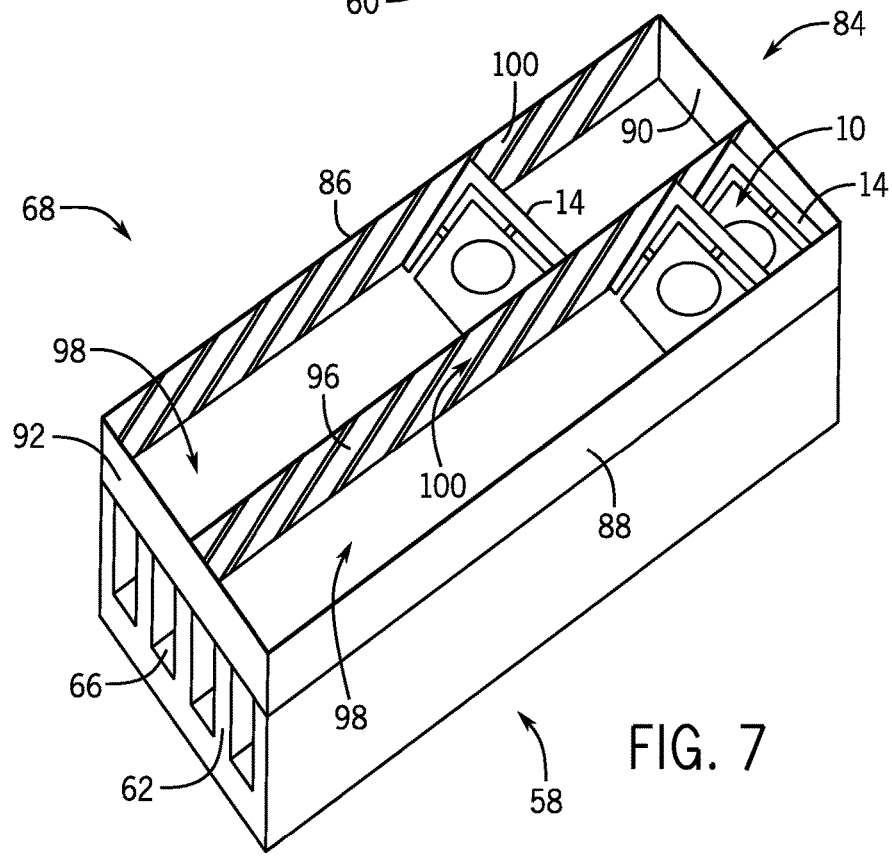
FIG. 7 is a perspective view of a mounting device of the thermal management system of FIGS. 5 and 6.

Now referring to FIGS. 5-7, various views of a computing device 54 and associated thermal management system 56 are shown, according to one embodiment of the invention, with the thermal management system 56 incorporating one or more active cooling devices therein—such as synthetic jet assemblies 10. As shown in FIGS. 5 and 6, a computing device 54 is provided that may be in the form of a circuit pack or industrial computing platform, although it is recognized that the computing device 54 could also be in the form of a high-performance enthusiast graphics card. A housing 55 may be provided for the computing device 54 that encloses a portion thereof and provides for mounting of a thermal management system 56 to the computing device 54.

Referring now to FIG. 6, which is a cross-sectional view of the computing device 54 and thermal management system 56 taken along line 6-6 of FIG. 5, thermal management system 56 is shown as including an extended surface element 58 disposed atop at least one heat generating component 60 (e.g., logic/graphics processing unit (GPU), etc.) of the computing device 54. According to embodiments of the invention, the extended surface element 58 may be any of a number of structures that provides for improved thermal transfer between the heat generating component 60 and the ambient environment, including a heat sink, a vapor chamber, or a metal element with embedded heat pipes (or similar device) with one or two phase liquids therein. The surface element may be formed of a metal material, non-metal material, or mix thereof.

As shown in the embodiment of FIG. 6, the extended surface element 58 includes a number of extended elements 62 formed thereon—such that the surface element 58 may best be described as a heat sink 58 that includes a number of heat sink fins 62 thermally coupled to a base plate 64. Heat sink fins 62 and base plate 64 can be formed of a variety of thermally conductive materials (e.g., aluminum, copper, etc.), as known in the art. In one embodiment of the invention, heat sink fins 62 are arranged in a one-dimensional array of "plate fins" defining channels 66 between them, as shown in FIG. 7. However, one having ordinary skill in the art would recognize that heat sink fins 62 may be arranged in a two-dimensional array of "pin fins." The heat from the at least one heat generating component 60 is transferred into the base 64, which in turns transfers heat into the fins 62. As a result, the fins 62 increase the surface area for heat transfer for cooling the at least one heat generating component 60.

Additionally, an interposer or mounting device/structure 68 is disposed along the top surface of the plurality of heat sink fins 62 to receive a plurality of active cooling devices, such as synthetic jet assemblies 10, therein. The mounting device 68 receives the synthetic jet assemblies 10 therein in a manner that orients each of the synthetic jet assemblies toward heat sink 58 at an angle 70 such that the cooling jet of fluid 22 expelled from each of the plurality of synthetic jet assemblies 10 impinges heat sink 58 at an angle of between 0° and 90°—and ideally between 5° and 45°. By directing the cooling jet of fluid 22 at the heat sink 58 at an angle, a thinner thermal boundary layer will be present about the heat sink fins 62 (as compared to a standard parallel flow of fluid across the fins)—thereby achieving improved heat transfer via the thermal management system 56.

A carrier 72 may be disposed between heat sink fins 62 and mounting device 68 in order to reduce acoustic noise created by the vibration of the plurality of synthetic jet assemblies 10. Carrier 72 may be a gasket or a frame comprising a metal or non-metal material. In addition, a tray 74 may also be disposed between base 64 of heat sink 58 and the at least one heat generating component 60 to assist with supporting heat sink 58. The tray 74 is arranged so as to be in thermal communication with the heat sink 58 and heat generating component 60.

As shown in FIG. 6, according to one embodiment of the invention, each of the heat sink fins 62 of heat sink 58 may include at least one notch 76 formed therein. Notch 76 would allow for fluid communication between channels 66, as the cooling jet of fluid 22 from each of the plurality of synthetic jet assemblies 10 would be able interact with multiple of the plurality of channels 66 via notches 76. In turn, the cooling jets of fluid 22 from the plurality of synthetic jet assemblies 10 would be able to provide superior cooling by interacting with the entire surface area provided by the plurality of fins 62—before exiting out the channels 66 at a side surface of the heat sink 58, as generally indicated at 77.

As further shown in FIG. 6, according to one embodiment of the invention, a plurality of orifices 78 are formed in base 64 of heat sink 58 to allow the a portion of the cooling jet of fluid 22 to pass through orifices 78 after impinging heat sink 58, while the rest of the cooling jet of fluid 22 runs along heat sink 58 and exits the heat sink 58 at side 77. It is recognized that this embodiment allows a portion of the cooling jet of fluid 22 to interact with at least one component 80 that is not thermally coupled to heat sink 58. In the instance where tray 74 is disposed between base 64 of heat sink 58 and heat generating component 60, it is contemplated that tray 74 is thermally coupled to component 80 (such as through a thermal interface material) and that heat can be disipated from component 80 through the tray 74, with tray 74 being cooled by the portion of the cooling jet of fluid 22 that passes through the orifices 78.

Referring now to FIG. 7, the structure of the mounting device 68 is discussed in greater detail and, as can be seen therein, the mounting device 68 includes a housing 84 comprising a first and second sidewall 86, 88 coupled with a first and second end wall 90, 92 to surround and create a cavity 94. Mounting device 68 may also include at least one divider wall 96 coupled to first and second end walls 90, 92 and configured to divide cavity 94 into at least two rows 98.

While, FIG. 7 shows mounting device 68 including a single divider wall 96 creating two rows 98, it is contemplated that mounting device 68 may contain more or less than two rows 98 created by more or less than one divider wall 96. According to an exemplary embodiment, it is recognized that wiring (not shown) for providing power to synthetic jet assemblies 10 positioned in the mounting device 68 can be routed along the divider wall 96, with four pin connections extending off of the wiring and being connectable to the synthetic jet assemblies to enable the synthetic jets to be operated at different frequencies.

A plurality of slots 100 are formed in the divider wall 96 and sidewalls of the mounting device 68 for receiving the synthetic jet assemblies 10 therein and orienting the synthetic jet assemblies at a desired angle relative to the heat sink 58. In an exemplary embodiment, the slots 100 are sized such that a mounting bracket 14 of a synthetic jet assembly 10 interfits with a respective slot 100 in order to secure the synthetic jet assembly 10 within the mounting device 68. The slots 100 are configured to orient each of the plurality of synthetic jet assemblies 10 at an angle 70 so as the cooling jet of fluid 22 expelled through orifice 30 of each of the plurality of synthetic jet assemblies 10 impinges heat sink 58 at angle 70 (e.g., angle between 5° and 45°, for example). According to one embodiment, an arrangement of up to twenty-four synthetic jet assemblies 10 can be fitted within the slots 100 of the mounting device 68.

Figure 8:
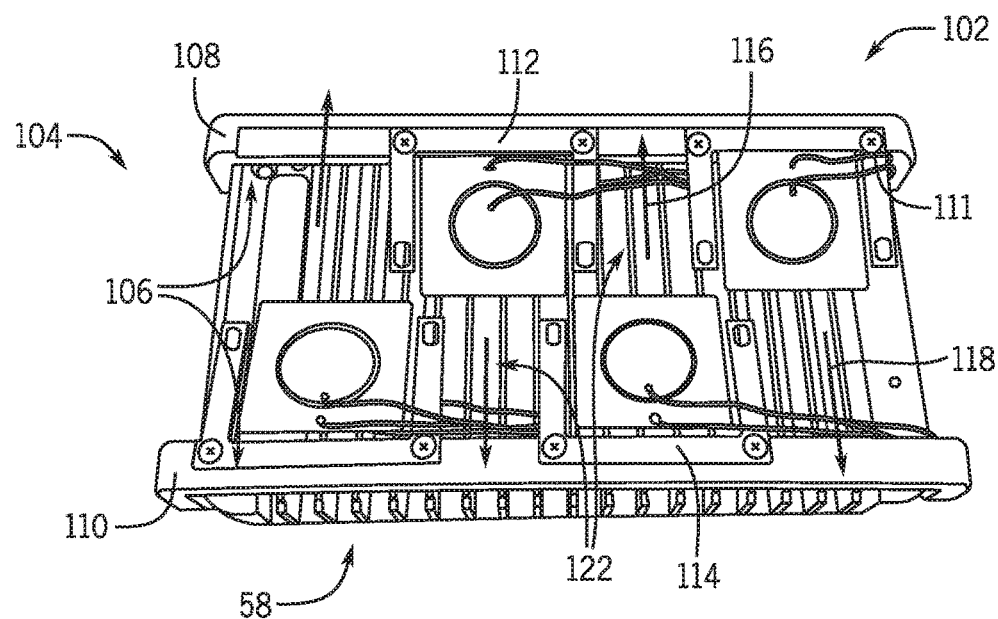
FIG. 8 is a perspective view of a mounting device included in a thermal management system, with synthetic jet assemblies of FIG. 1 affixed thereto, according to another embodiment of the invention.

Now referring to FIG. 8, a perspective view of a thermal management system 102 is shown, according to another embodiment of the invention. In this embodiment, similar to the embodiment of FIGS. 5 and 6, thermal management system 102 again includes heat sink 58 disposed atop at least one heat generating component 60, wherein heat sink 58 comprises a plurality of fins 62 thermally coupled to a base 64. It is contemplated that fins 62 and base plate 64 can be formed from a variety of thermally conductive materials, as known in the art. In one embodiment of the invention, heat sink fins 62 are arranged in a one-dimensional array of "plate fins" defining channels 66 between them. However, one having ordinary skill in the art would recognize that heat sink fins 62 may be arranged in a two-dimensional array of "pin fins." The heat from the at least one heat generating component 60 is transferred into the base 64, which in turns transfers heat into the fins 62. As a result, the fins 62 increase the surface area for heat transfer for cooling the at least one heat generating component 60.

Figure 9:
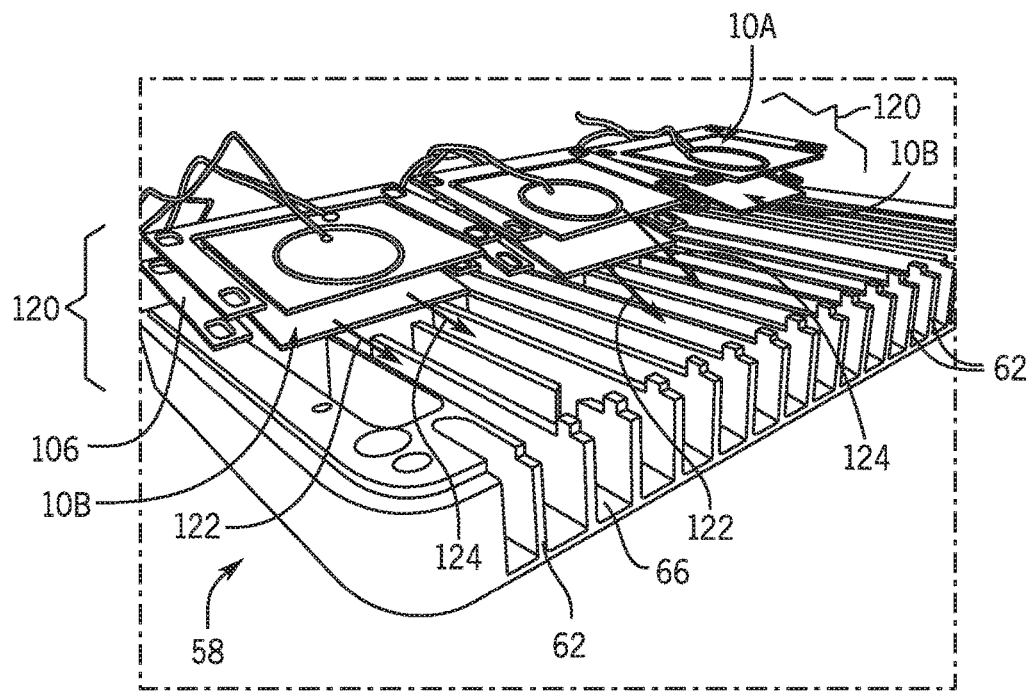
FIG. 9 is a perspective view of a mounting device included in a thermal management system, with synthetic jet assemblies of FIG. 1 affixed thereto, according to another embodiment of the invention.

The thermal management system 102 also includes a mounting device 104 (i.e., "interposer") that is disposed along the top surface of the plurality of heat sink fins 62. In this embodiment, mounting device 104 comprises at least one rail 106, which is coupled to heat sink 58 via a plurality of fasteners (not shown). While FIG. 8 illustrates mounting device 104 having a first rail 108 and a second rail 110, it is contemplated that mounting device 104 may have a single rail 106, as shown in FIG. 9, or more than two (2) rails 106. As shown in FIG. 8, synthetic jet assemblies 10 are coupled to mounting device 104 via the rails 108, 110 with fasteners 111 affixing the bracket 14 of each synthetic jet assembly 10 to the rails 108, 110.

In affixing the synthetic jet assemblies 10 to the rails 108, 110, the synthetic jet assemblies 10 are arranged such that a first number 112 of the synthetic jet assemblies 10 are coupled to first rail 108 and a second number 114 of the synthetic jet assemblies 10 are coupled to second rail 110. In this embodiment, the first number 112 of the plurality of synthetic jet assemblies 10 are oriented to direct cooling jets of fluid 22 in a first direction 116. Meanwhile, the second number 114 of synthetic jet assemblies 10 are oriented to direct cooling jets of fluid 22 expelled through orifice 30 of each synthetic jet assemblies 10 in a second direction 118.

As previously mentioned, FIG. 9 depicts an alternative embodiment wherein mounting device 104 comprises a single rail 106. In this embodiment, the synthetic jet actuator assemblies 10 are separated/arranged into a plurality of synthetic jet stacks 120 that are each affixed to the rail 106, such as via fasteners. While FIG. 9 depicts two (2) synthetic jet assemblies 10A, 10B in each synthetic jet stack 120, it is contemplated each synthetic jet stack 120 may contain more or less than two (2) synthetic jet assemblies 10A, 10B. In the illustrated embodiment, the two (2) synthetic jet assemblies 10A, 10B of each synthetic jet stack 120 are affixed to the rail 106, and positioned relative to each other, so as to be oriented toward heat sink 58 at different angles—in order to provide what can generally referred to as "short range" and "long range" cooling to the heat sink 58. That is, by orienting each of the synthetic jet assemblies 10A, 10B of a synthetic jet stack 120 at a different angle relative to the heat sink 58, the cooling jets of fluid 22 generated by the synthetic jet assemblies 10A, 10B will impinge the heat sink 58 at multiple locations therealong.

As an example, a first synthetic jet assembly 10A of a synthetic jet stack 120 may be oriented so as to direct a cooling jet of fluid 22 toward the heat sink 58 at an angle of approximately 5°-40° to provide a "short range" flow that impinges on the heat sink 58 at a location proximate the synthetic jet assembly 10A—generally indicated at 122. A second synthetic jet assembly 10B of a synthetic jet stack 120 may be oriented so as to direct a cooling jet of fluid 22 toward the heat sink 58 at an angle of approximately 2°-20° to provide a "long range" flow that impinges on the heat sink 58 at a location more distal from the synthetic jet assembly 10A—generally indicated at 124. The above angles/angular ranges are meant to be an example only, and it is to be understood that the angular orientation of each of the synthetic jet assemblies 10A, 10B relative to the heat sink 58 can be set as desired—thereby providing flexibility in the thermal management system 102 to accomplish an effective thermal management performance for a wide variety of applications as required.

Figure 10:
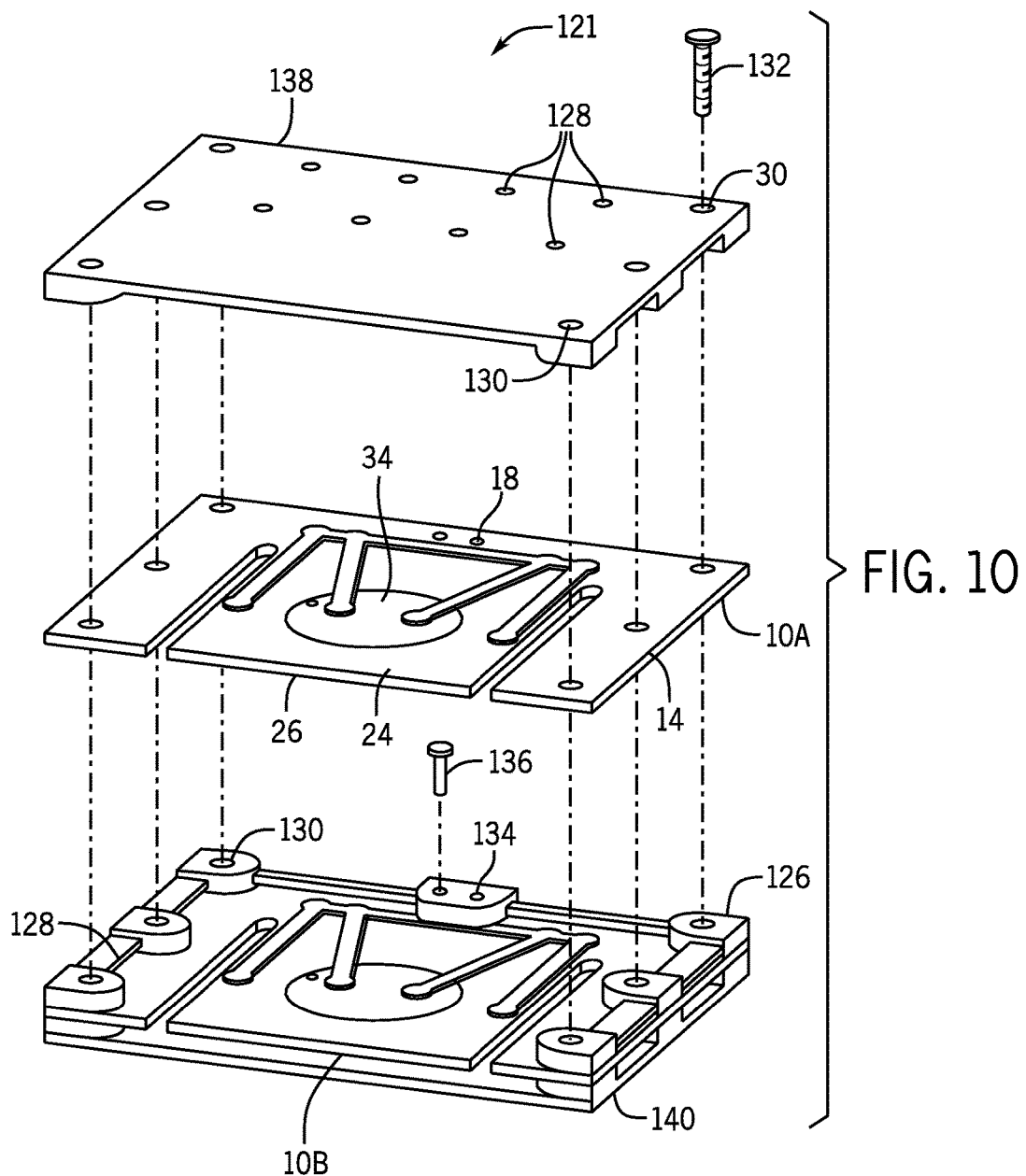
FIG. 10 is an exploded view of a synthetic jet pack usable with the mounting devices of FIGS. 8 and 9.

In an alternative embodiment, a synthetic jet pack 121 (i.e., DCJ pack) may be used instead of synthetic jet stack 120. FIG. 10 shows an exploded perspective view of synthetic jet pack 121, according to an embodiment of the invention. In this embodiment, synthetic jet pack 121 includes a first synthetic jet assembly 10A and a second synthetic jet assembly 10B. While FIG. 10 depicts the use of two synthetic jet assemblies 10, it is contemplated that more or less than two (2) synthetic jet assemblies 10 may be used. As previously mentioned with respect to FIGS. 1-4, each of first synthetic jet assembly 10A and second synthetic jet assembly 10B include mounting bracket 14, actuators 34, 36, first plate 24, second plate 26, wall 28, and circuit driver 18.

In the exemplary embodiment, first synthetic jet assembly 10A and second synthetic jet assembly 10B are stacked in a vertical stack formation. Alternatively, first synthetic jet assembly 10A and second synthetic jet assembly 10B may be stacked in a horizontal stack formation and/or any other formation that enables the synthetic jet pack 121 to function as described herein. Also in the exemplary embodiment, first synthetic jet assembly 10A and second synthetic jet assembly 10B are coupled to a spacer 126 positioned between first and second synthetic jet assemblies 10A, 10B. Spacer 126 defines an area between first synthetic jet assembly 10A and second synthetic jet assembly 10B and, according to one embodiment, provides for a positioning of first synthetic jet assembly 10A and second synthetic jet assembly 10B at differing angles relative to the heat sink 58 (FIG. 9). To provide for the positioning of first synthetic jet assembly 10A and second synthetic jet assembly 10B at differing angles relative to the heat sink 58, a thickness of the spacers may be varied along a length of the sides of the pack 121. That is, spacers 126 at the back edge of the synthetic jet pack 121 may have an increased thickness as compared to spacers 126 at the front edge of the synthetic jet pack 121, or vice versa. Of course it is recognized that each of the spacers 126 could have an equal thickness, such that each of the first synthetic jet assembly 10A and second synthetic jet assembly 10B are positioned at a same angle relative to the heat sink 58. Accordingly, the spacers 126 may be utilized to optimize an arrangement of the synthetic jet pack 121 relative to the heat sink.

In an exemplary embodiment, spacer 126 further defines at least one ventilation hole 128 that facilitates the ventilation of air through each layer of synthetic jet assemblies 10, and the ventilation of air facilitates reducing the temperature of synthetic jet pack 121. Ventilation holes 128 can be various shapes and dimensions to facilitate the movement of air through synthetic jet stack 121. Spacer 126 may further define a plurality of fastening holes 130 configured to receive at least one fastener 132, e.g., without limitation, a pin, screw, bolt, clip, adhesive, or any other device capable of fastening first synthetic jet assembly 10A to second synthetic jet assembly 10B. In the exemplary embodiment, spacer 126 also defines a contact hole 134 that may receive at least one electrically conductive element 136—such as a connector plug that extends through contact hole 134. The electrically conductive element 136 therefore serves as a power feed between respective circuit drivers 18 of first and second synthetic jet assemblies 10A, 10B.

Also in the exemplary embodiment, a cap assembly 138 is coupled to the top of synthetic jet pack 121. Cap assembly 138 includes a plurality of ventilation holes 128. Cap assembly 138 may also include a plurality of fastening holes 130. Base assembly 140 is coupled to second synthetic jet assembly 10B, and includes a plurality of fastening holes 130 that facilitate fastening of second synthetic jet assembly 10B to base assembly 140. In the exemplary embodiment, at least one fastening hole 130 extends from cap assembly 138 to base assembly 140 and facilitates coupling synthetic jet pack 121 to another device, such as mounting device 104.

Figure 11:
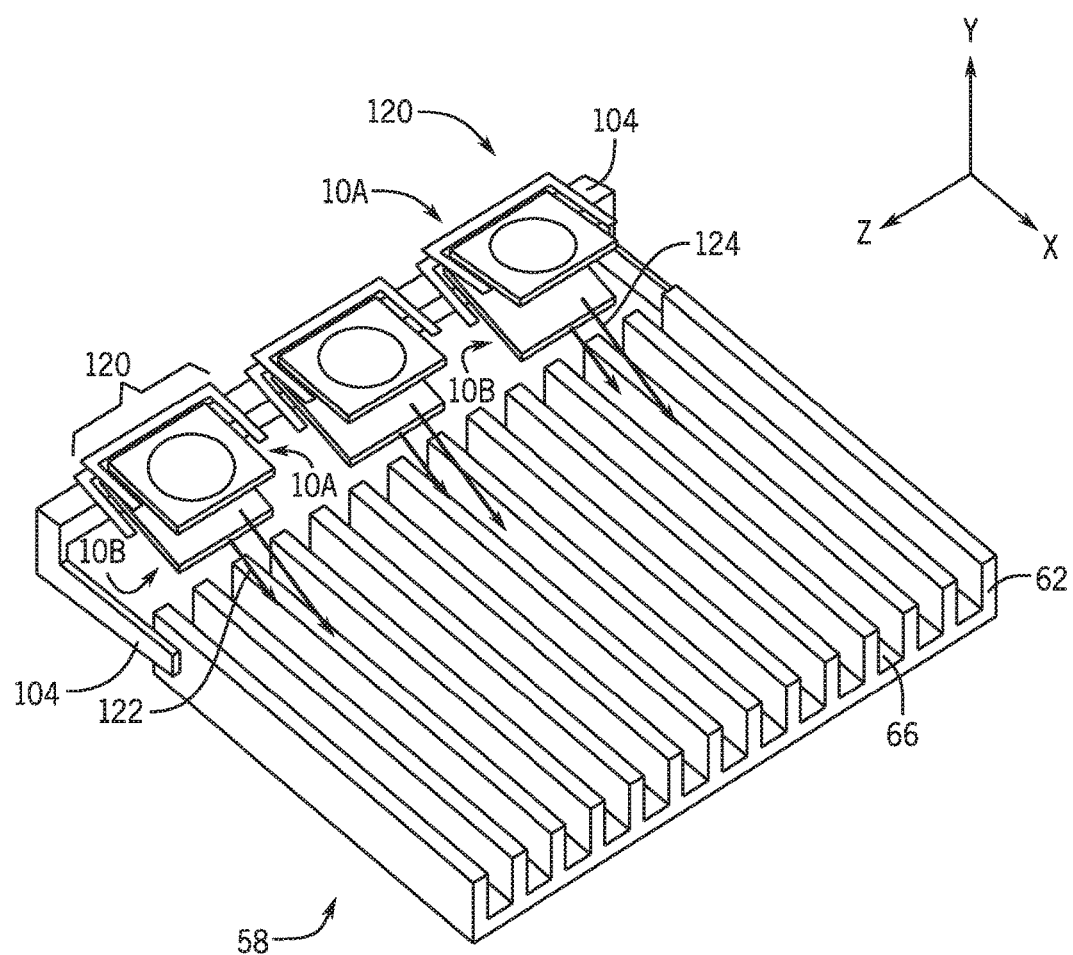
FIG. 11 is a perspective view of a mounting device included in a thermal management system, with synthetic jet assemblies of FIG. 1 affixed thereto, according to another embodiment of the invention.

According to yet another embodiment of the invention, and as shown in FIG. 11, a mounting device 104—whether comprising first rail 108 and second rail 110 (FIG. 8), a single rail 106 (FIG. 9), or more than two (2) rails 106—may be provided that extends away from the heat sink 58 in the x-direction, to provide for a mounting of synthetic jet assemblies 10A, 10B (or synthetic jet stacks 120 or packs 121) thereto. Such an arrangement may be desired where severe height constraints are present for the electronics system and associated thermal management system, but more space is available to the side of the system. Beneficially, by positioning the mounting device 104 and synthetic jet assemblies 10A, 10B to the side of the heat sink 58, the cooling jets of fluid 22 are able to interact with the entire length of heat sink 58.

Beneficially, embodiments of the invention thus provide a thermal management system that utilizes active cooling devices to direct a fluid flow across a heat sink, with a mounting structure being implemented to orient the cooling devices at an angle to the heat sink so as to reduce a volume of overall thermal management system. That is, the angular mounting of the active cooling devices provided by the mounting structure allows for a vertical height of the active cooling devices (i.e., synthetic jet assemblies) to be minimized—with the interposer and synthetic jet assemblies having a height of approximately 5 mm, for example. This is compared to a standard cooling fan positioned on a heat sink that might have a height of 25 mm.

As an additional benefit, by orienting the cooling devices at an angle to the heat sink, improved cooling performance can also be achieved in the thermal management system. By directing cooling jets of fluid at the heat sink at an angle, a thinner thermal boundary layer will be present about the heat sink fins—as compared to a standard parallel flow of fluid across the fins)—thereby achieving improved heat transfer via the thermal management system.

The above mentioned benefits can be achieved by the thermal management system, while operating with lower acoustic noise and increased durability.

Therefore, according to one embodiment of the invention, a thermal management system includes a surface having a plurality of extended elements thermally coupled to the surface, a plurality of vibrator assemblies configured to generate a cooling flow across the surface, and a mounting structure disposed atop the plurality of extended elements of the surface to position the plurality of vibrator assemblies relative to the surface. Further, the mounting structure is configured to orient each of the plurality of vibrator assemblies to the surface at an angel, such that the cooling flow generated by the plurality of vibrator assemblies impinges on the extended elements at an angle.

According to another embodiment of the invention, a system includes at least one heat generating component, a surface element thermally coupled to the at least one heat generating component, a plurality of synthetic jet assemblies, and a mounting device disposed atop the surface element and configured to orient each of the plurality of synthetic jet assemblies at an angle relative to the surface element. Each synthetic jet assembly comprises a synthetic jet configured to generate a flow of cooling fluid and a mounting bracket coupled to the synthetic jet. Further, the flow of cooling fluid generated by each of the plurality of synthetic jet assemblies impinges on the surface element at an angle.

According to yet another embodiment of the invention, a method of manufacturing a thermal management system includes providing an electrical system having at least one heat generating component and mounting a surface element on the electrical system such that it is in thermal communication with the at least one heat generating component, the surface element including a plurality of extended elements protruding therefrom to aid in convective heat transfer from the surface element. The method also includes affixing a mounting structure to the heat sink adjacent the plurality of extended elements and coupling a plurality of synthetic jet assemblies to the mounting structure such that each of the plurality of synthetic jet assemblies are positioned at an angel relative to the surface element.

While the invention has been described in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A thermal management system comprising:
a surface having a plurality of extended elements thermally coupled to the surface;
a plurality of vibrator assemblies configured to generate a cooling flow across the surface, each of the plurality of vibrator assemblies comprising:
a synthetic jet assembly that includes:
first and second plates coupled via a spacer element to create a cavity, the spacer element including at least one orifice formed therein;
an actuator coupled to at least one of the first and second plates to selectively cause deflection thereof; and
a circuit driver electrically coupled to the at least one actuator to cause at least one of the first and second plates to selectively deflect, so as to change a volume of the cavity and cause the cooling flow to be expelled from the at least on orifice; and
a u-shaped mounting bracket affixed to the synthetic jet assembly so as to be positioned partially thereabout; and
a mounting structure disposed atop the plurality of extended elements of the surface to position the plurality of vibrator assemblies above the extended elements, the mounting structure configured to mate with the u-shaped mounting bracket of each respective vibrator assembly to position the plurality of vibrator assemblies above the extended elements and orient each of the plurality of vibrator assemblies to the surface at an acute angle, such that the cooling flow generated by the plurality of vibrator assemblies impinges on the extended elements at an acute angle;
wherein the mounting structure comprises:
first and second sidewalls coupled via first and second endwalls to create a cavity;
at least one divider wall disposed between the first and second sidewalls and coupled to the first and second endwalls, the at least one divider wall configured to divide the cavity into at least two rows; and
a plurality of acutely angled slots formed in the first sidewall, the second sidewall, and the at least one divider wall, the plurality of acutely angled slots configured to interfit with the u-shaped mounting bracket of each of the plurality of vibrator assemblies to mount the vibrator assemblies within the mounting structure.

2. The thermal management system of claim 1 further comprising a carrier disposed between the mounting structure and the surface.

3. The thermal management system of claim 1 wherein the mounting structure comprises a first rail and a second rail that are affixed to the surface on opposing ends thereof, with a first number of the plurality of vibrator assemblies being coupled to the first rail and a second number of the plurality of vibrator assemblies being coupled to the second rail; and
wherein the first number and second number of vibrator assemblies are coupled to the first and second rails via fasteners that affix the u-shaped mounting bracket of each respective vibrator assembly to the first and second rails.

4. The thermal management system of claim 3 wherein the first number of the plurality of vibrator assemblies is oriented at an acute angle in a first direction, and the second number of the plurality of vibrator assemblies is oriented at an acute angle in a second direction, such that a cooling flow generated by the first number of the plurality of vibrator assemblies is generally opposite a cooling flow generated by the second number of the plurality of vibrator assemblies.

5. The thermal management system of claim 1 wherein the mounting structure comprises a rail affixed to the surface on one end thereof; and
wherein the plurality of vibrator assemblies are arranged into a plurality of vibrator assembly stacks that each include at least one vibrator assembly, with each of the plurality of vibrator assembly stacks or packs being coupled to the rail.

6. The thermal management system of claim 5 wherein each of the vibrator assembly stacks or packs comprise a first vibrator assembly and a second vibrator assembly arranged vertically, wherein the first and second vibrator assemblies are oriented at different acute angles.

7. The thermal management system of claim 6 wherein the first vibrator assembly in a vibrator assembly stack or pack is at an angle of between 2°-20° and the second vibrator assembly in the vibrator assembly stack or pack is at an angle of between 5°-40°, such that the cooling flow generated by the first and second vibrator assemblies impinge on the surface at different locations.

8. A system comprising:
at least one heat generating component;
a surface element thermally coupled to the at least one heat generating component, the surface element comprising a heat sink including a base with a plurality of fins extending up therefrom;
a plurality of synthetic jet assemblies, each comprising:
a synthetic jet configured to generate a flow of cooling fluid, the synthetic jet including:
first and second plates coupled via a spacer element to create a cavity, the spacer element including at least one orifice formed therein; and
an actuator coupled to at least one of the first and second plates to selectively cause deflection thereof to change a volume of the cavity and cause the flow of cooling fluid to be expelled from the at least on orifice; and
a u-shaped mounting bracket coupled to the synthetic jet so as to partially surround the first and second plates; and
a mounting device disposed atop the surface element and configured to mount each of the plurality of synthetic jet assemblies above the surface element and orient each of the plurality of synthetic jet assemblies at an acute angle relative to the surface element, with the u-shaped mounting bracket of each respective synthetic jet assembly mating with the mounting device to mount each of the plurality of synthetic jet assemblies above the surface element and to orient the synthetic jet assembly at the acute angle; and
a tray disposed between the at least one heat generating component and the heat sink so as to be in thermal communication therewith;
wherein the flow of cooling fluid generated by each of the plurality of synthetic jet assemblies impinges on the surface element at the acute angle;
wherein the base of the heat sink includes a plurality of openings formed therein, such that a portion of the flow of cooling fluid generated by each of the plurality of synthetic jet assemblies passes through the openings to provide cooling to the at least one heat generating component; and wherein the portion of the flow of cooling fluid that passes through the openings provides cooling to the tray.

9. The system of claim 8 wherein the mounting device comprises:
   a housing defining a cavity;
   at least one divider wall disposed within the housing to divide the cavity into at least two rows;
   a plurality of acutely angled slots formed in the housing and in the at least one divider wall, the plurality of acutely angled slots further configured to interfit with the u-shaped mounting bracket of each of the plurality of synthetic jet assemblies to secure the plurality of synthetic jet assemblies within the housing.

10. The system of claim 8 wherein the mounting device comprises at least one rail affixed to the surface element.

11. The system of claim 10 wherein the at least one rail comprises:
    a first rail positioned at a first end of the surface element; and
    a second rail positioned at a second end of the surface element;
    wherein a first portion of the plurality of synthetic jet assemblies is coupled to the first rail and oriented at an acute angle in a first direction; and
    wherein a second portion of the plurality of synthetic jet assemblies is coupled to the second rail and oriented at an acute angle in a second direction.

12. The system of claim 10 wherein the at least one rail comprises a single rail, and wherein the plurality of synthetic jet assemblies are coupled to the single rail so as to be arranged into a plurality of synthetic jet stacks that each include at least one synthetic jet, with each of the plurality of synthetic jet stacks being coupled to the single rail.

13. The system of claim 10 wherein the plurality of synthetic jet assemblies comprises an arrangement of synthetic jet stacks or a plurality of synthetic jet packs.

14. The system of claim 13 wherein each of the synthetic jet stacks or synthetic jet packs comprises a first synthetic jet oriented at a first acute angle and a second synthetic jet oriented at a second acute angle different from the first acute angle, the first and second synthetic jets being arranged vertically.

15. A system comprising:
    at least one heat generating component;
    a surface element thermally coupled to the at least one heat generating component;
    a plurality of synthetic jet assemblies, each comprising:
       a synthetic jet configured to generate a flow of cooling fluid, the synthetic jet including:
          first and second plates coupled via a spacer element to create a cavity, the spacer element including at least one orifice formed therein; and
          an actuator coupled to at least one of the first and second plates to selectively cause deflection thereof to change a volume of the cavity and cause the flow of cooling fluid to be expelled from the at least on orifice; and
       a u-shaped mounting bracket coupled to the synthetic jet so as to partially surround the first and second plates; and
    a mounting device disposed atop the surface element and configured to mount each of the plurality of synthetic jet assemblies above the surface element and orient each of the plurality of synthetic jet assemblies at an acute angle relative to the surface element, with the u-shaped mounting bracket of each respective synthetic jet assembly mating with the mounting device to mount each of the plurality of synthetic jet assemblies above the surface element and to orient the synthetic jet assembly at the acute angle;
    wherein the flow of cooling fluid generated by each of the plurality of synthetic jet assemblies impinges on the surface element at the acute angle; and
    wherein the mounting device comprises:
       a housing defining a cavity;
       at least one divider wall disposed within the housing to divide the cavity into at least two rows; and
       a plurality of acutely angled slots formed in the housing and in the at least one divider wall, the plurality of acutely angled slots further configured to interfit with the u-shaped mounting bracket of each of the plurality of synthetic jet assemblies to secure the plurality of synthetic jet assemblies within the housing.

* * * * *